(12) United States Patent
Eun et al.

(10) Patent No.: US 7,527,704 B2
(45) Date of Patent: May 5, 2009

(54) METHOD FOR PREPARING FILM STRUCTURE COMPRISING FERROELECTRIC SINGLE CRYSTAL LAYER

(75) Inventors: Jaehwan Eun, Jeonju-si (KR); Sang-Goo Lee, Siheung-si (KR); Byungju Choi, Incheon (KR); Sungmin Rhim, Seongnam-si (KR)

(73) Assignee: Ibule Photonics, Inc. (KR)

( * ) Notice: Subject to any disclaimer, the term of this patent is extended or adjusted under 35 U.S.C. 154(b) by 302 days.

(21) Appl. No.: 10/539,886

(22) PCT Filed: Jul. 14, 2003

(86) PCT No.: PCT/KR03/01390

§ 371 (c)(1),
(2), (4) Date: Jun. 17, 2005

(87) PCT Pub. No.: WO2004/055875

PCT Pub. Date: Jul. 1, 2004

(65) Prior Publication Data

US 2006/0207713 A1    Sep. 21, 2006

(30) Foreign Application Priority Data

Dec. 17, 2002   (KR) .................... 10-2002-0080745

(51) Int. Cl.
| | | |
|---|---|---|
| B32B 38/10 | (2006.01) | |
| H01L 21/02 | (2006.01) | |
| H01L 21/04 | (2006.01) | |
| H01L 21/77 | (2006.01) | |
| H01L 21/302 | (2006.01) | |
| H01L 21/461 | (2006.01) | |
| B32B 38/18 | (2006.01) | |
| H01L 21/76 | (2006.01) | |
| H01L 21/304 | (2006.01) | |
| H01L 21/306 | (2006.01) | |
| H01L 21/463 | (2006.01) | |
| H01L 21/465 | (2006.01) | |

(52) U.S. Cl. .................. 156/281; 156/268; 156/278; 257/347; 257/354; 257/505; 257/507; 438/8; 438/40; 438/444; 438/689; 438/734

(58) Field of Classification Search ............... 156/267, 156/268, 278, 281; 257/347, 359, 505, 507; 438/8, 40, 444, 489, 689, 734
See application file for complete search history.

(56) References Cited

U.S. PATENT DOCUMENTS 3,715,802 A * 2/1973 Suenaga et al. ............ 438/107
4,772,985 A * 9/1988 Yasumoto et al. ........ 361/321.3

(Continued)

FOREIGN PATENT DOCUMENTS

DE     4037271 A  *  7/1991

(Continued)

*Primary Examiner*—Phillip C Tucker
*Assistant Examiner*—Sonya Mazumdar
(74) *Attorney, Agent, or Firm*—Baker Hostetler LLP

(57) ABSTRACT

A film structure of a ferroelectric single crystal which can be beneficially used in the fabrication of high-performance electric or electronic parts or devices is prepared by adhering a ferroelectric single crystal plate to a substrate by a conductive adhesive or metal layer, the ferroelectric single crystal plate being polished before or after the adhesion with the substrate.

6 Claims, 4 Drawing Sheets

U.S. PATENT DOCUMENTS

| | | | |
|---|---|---|---|
| 5,183,593 A * | 2/1993 | Durand et al. | 252/514 |
| 5,925,968 A * | 7/1999 | Yachi et al. | 310/320 |
| 6,568,265 B2 * | 5/2003 | Shibue et al. | 73/335.05 |
| 7,136,874 B2 * | 11/2006 | Mercer et al. | 707/104.1 |
| 2001/0035123 A1 * | 11/2001 | Lee et al. | 117/3 |
| 2002/0048076 A1 * | 4/2002 | Kondo et al. | 359/322 |
| 2004/0072432 A1 * | 4/2004 | Yun et al. | 438/689 |
| 2006/0042541 A1 * | 3/2006 | Eun et al. | 117/104 |

FOREIGN PATENT DOCUMENTS

| | | |
|---|---|---|
| EP | 0 855 738 A2 | 7/1998 |
| JP | 09186376 A * | 7/1997 |
| JP | 2000-068455 A | 3/2000 |

\* cited by examiner

METHOD FOR PREPARING FILM STRUCTURE COMPRISING FERROELECTRIC SINGLE CRYSTAL LAYER

FIELD OF THE INVENTION

The present invention relates to a method for preparing a film structure comprising a ferroelectric single crystal, useful for the fabrication of many electric or electronic devices including a microactuator, particularly by way of employing an adhesion method.

BACKGROUND OF THE INVENTION

A ferroelectric thin film or thick film is frequently used in various electric and electronic parts, and it has been hitherto prepared by coating a PZT film on a substrate by a screen-printing or sol-gel method, calcining the coated substrate to crystallize the material, or by depositing the single crystal-forming raw material under a vacuum (see N. Setter, Piezoelectric Materials in Devices, Ceramics Laboratory, EPFL 2002).

Although the prior methods are simple and convenient, the film thus prepared still exhibits unsatisfactory performance characteristics in terms of current loss, electromechanical coupling coefficient and dielectric constant. Further, the calcination step of the prior methods requires the use of a high-cost, high-melting metal such as Pt and Au as an electrode material.

Therefore, there has existed a need to develop a simple method of providing a ferroelectric film, especially in the form of a single crystal layer, of improved properties suitable for electric and electronic devices and parts.

SUMMARY OF THE INVENTION

It is, therefore, a primary object of the invention to provide a novel method for preparing a ferroelectric film structure using a ferroelectric single crystal having a high dielectric constant together with good electromechanical and electrooptical properties.

In accordance with an aspect of the present invention, there is provided a method for preparing a film structure of a ferroelectric single crystal, which comprises adhering a ferroelectric single crystal plate to a substrate by a conductive adhesive or metal layer.

BRIEF DESCRIPTION OF THE DRAWINGS

The above and other objects and features of the present invention will become apparent from the following description thereof, when taken in conjunction with the accompanying drawings which respectively show.

DETAILED DESCRIPTION OF THE INVENTION

Figure 1:
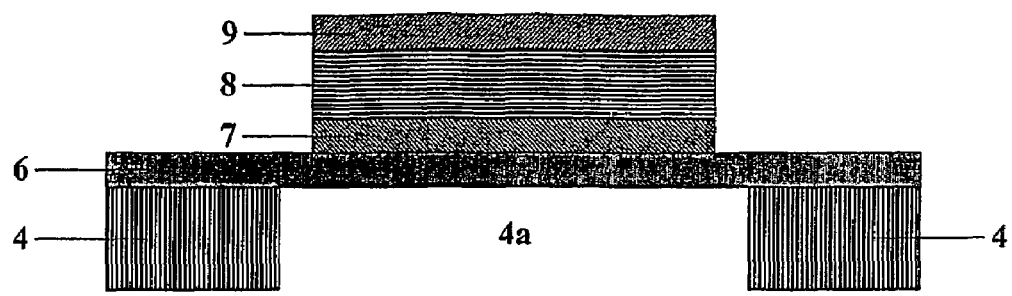
FIG. 1: a cross-sectional view of the structure of a general type microactuator.

The inventive method for forming a ferroelectric film structure is characterized by adopting an adhesion process, which does not require a high-temperature heat treatment step, using a ferroelectric single crystal having a high dielectric constant and good electromechanical and electro-optical properties.

In the present invention, a ferroelectric single crystal material having a dielectric constant of 1,000 or higher as measured in the form of a film may be preferably employed.

Representative examples of the ferroelectric single crystal used in the present invention include PMN-PT (lead magnesium niobate-lead titanate), PZN-PT (lead zinc niobate-lead titanate), LN (lithium niobate, $LiNbO_3$), and LT (Lithium tanthalate, $LiTaO_3$) and other piezoelectric and electrooptical materials known in the art.

The PMN-PT- and PZN-PT-based materials preferably have the composition of formula (I):

$$x(A)y(B)z(C)\text{-}p(P)n(N) \qquad (I)$$

wherein, (A) is $Pb(Mg_{1/3}Nb_{2/3})O_3$ or $Pb(Zn_{1/3}Nb_{2/3})O_3$, (B) is $PbTiO_3$, (C) is $LiTaO_3$, (P) is a metal selected from the group consisting of Pt, Au, Ag, Pd and Rh, (N) is an oxide of a metal selected from the group consisting of Ni, Co, Fe, Sr, Sc, Ru, Cu and Cd, x is a number in the range of 0.65 to 0.98, y is a number in the range of 0.01 to 0.34, z is a number in the range of 0.01 to 0.1, and p and n are each independently a number in the range of 0.01 to 5.

The material of formula (I) is a homogeneous single crystal and it may be prepared by a solid phase reaction followed by melting-crystallization, as disclosed in Korean Patent Laid-open Publication No. 2001-96505. Specifically, the materials of formula (I) may be prepared by (a) mixing a component selected from $Pb(Mg_{1/3}Nb_{2/3})O_3$ and $Pb(Zn_{1/3}Nb_{2/3})O_3$ with $PbTiO_3$, and $LiTaO_3$, in relative molar amounts ranging from 0.65 to 0.98, 0.01 to 0.34 and 0.01 to 0.1, respectively, (b) adding to the mixture obtained in (a), a metal selected from the group consisting of Pt, Au, Ag, Pd and Rh, and an oxide of a metal selected from the group consisting of Ni, Co, Fe, Sr, Sc, Ru, Cu and Cd, in amounts ranging from 0.01 to 5% by weight based on the mixture, (c) calcining the mixture obtained in (b), followed by pulverizing the calcination product, (d) melting the powder obtained in (c), and (e) cooling the melt to crystallize. The single crystal prepared by the above procedure preferably has a diameter of 5 cm or greater.

The LN single crystal can be prepared from $Li_2CO_3$ and $Nb_2O_5$, and the LT single crystal, from $Li_2CO_3$ and $Ta_2O_5$, by Czochralski's method (see Yuhuan Xu, Ferroelectric materials and their applications, pp 221-224, North-holland (1991)). These materials are commercially available.

In particular, the ferroelectric single crystal of formula (I) has an electromechanical coupling coefficient superior to that of the existing PZT single or poly crystal as well as a high driving voltage, a wide range of bending deformation, and good electrooptical property, and thus it can be processed minutely. The ferroelectric material of formula (I) has a dielectric constant of about 7,000 (in a film form, about 2,000), a loss piezoelectric constant of about 0.001 (in a film form, about 0.003), $d_{33}$ of about 2,500 and $k_{33}$ of about 0.97. The existing PZT film typically shows a dielectric constant of about 400 to 500 and a loss piezoelectric constant of about 0.006 to 0.02.

The method of preparing a single crystal film structure according to the present invention is described below with reference to the accompanying drawings.

FIG. 1 schematically shows an embodiment of a general type microactuator comprising a top electrode (9) and a bottom electrode (7) for applying an electric field thereto, a piezoelectric single crystal (8) disposed therebetween, a vibration plate (6) vibrated by the deformation of the piezoelectric single crystal (8), and a substrate region (4, 4a). Although the formation of the vibration plate (6) and the substrate region (4, 4a) can be easily achieved by a conventional method, the fabrication of the laminated structure composed of the top electrode (9), the bottom electrode (7) and the piezoelectric single crystal (8) is so difficult that the laminated structure can have a high performance.

In accordance with the present invention, a high performance single crystal film structure can be simply prepared by polishing a ferroelectric single crystal plate to form a thin film and then adhering the single crystal film to a substrate using a conductive adhesive or metal layer, or by adhering a ferroelectric single crystal plate to a substrate and then polishing the surface of single crystal of the laminate. The polishing may be achieved by a conventional mechanical or chemical-mechanical polishing method.

In the inventive method, the adhesion of the single crystal to the substrate is conducted at a relatively low temperature. Therefore, in accordance with the present invention, the high temperature heat treatment at about 1,000° C. employed in the conventional method for the formation of the ferroelectric film can be avoided, and an inexpensive metal such as aluminum having a low melting point can be employed as an electrode material.

FIGS. 2a to 2h show the procedure for preparing a single crystal film structure according to the present invention, and the procedure for fabricating a general type microactuator as an embodiment of a device using the film structure.

Figure 2A:
FIG. 2a to 2h: the procedure for preparing a single crystal film structure according to the present invention, and the procedure for fabricating a microactuator using same.

Specifically, FIG. 2a represents the step of forming a silicon dioxide layer (60) to be used as a vibration plate of a microactuator, on a substrate (40) such as silicon. The silicon dioxide layer may be formed to a thickness of 1 to 5 μm using oxygen or steam by a conventional oxidation method. Alternatively, the silicon dioxide layer may be, at first, formed to a thickness of 300 to 500 nm by the oxidation method, and then the formed layer may be further grown to a desired thickness by a chemical deposition method.

In addition to the silicon oxide, any oxide materials, which can be deposited by a general deposition method such as a sputtering, E-beam evaporation etc., are available for vibration plate. For example, MgO, $Al_2O_3$ and ZnO can replace the silicon oxide.

Figure 2B:
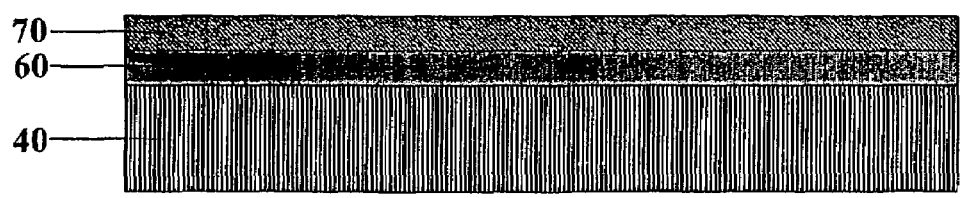
Figure 2C:
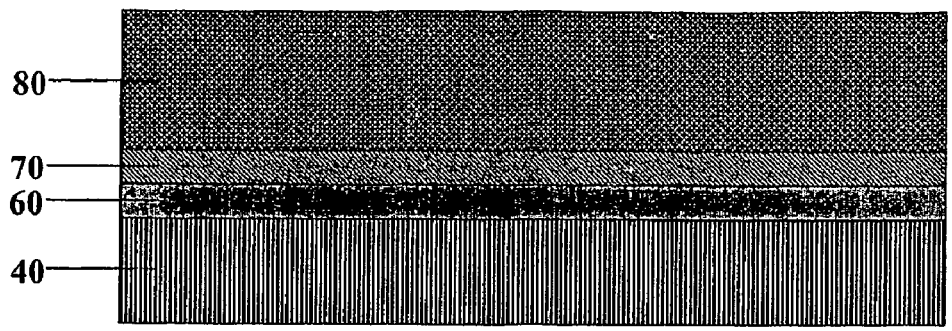

FIG. 2b shows the step of applying a conductive adhesive (70) such as a gold (Au) or silver (Ag) containing epoxy paste adhesive or a platinum (Pt) containing adhesive sol on the silicon dioxide layer (60), and FIG. 2c depicts the step of laminating a single crystal plate (80) to the adhesive layer (70) and then heat-treating the laminate. The epoxy paste and the Pt sol are commercially available and can be uniformly applied by a spin-coating or screen-printing method.

Figure 3:
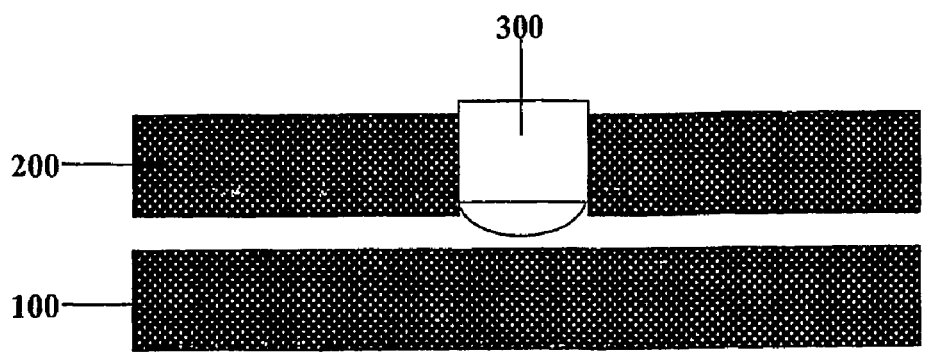
FIG. 3: a cross-sectional view of a pressurizing means used in the inventive method to form an adhesive layer uniformly.

In order to effectively transfer the vibration of the single crystal plate via the vibration plate, it is important to form the adhesive layer (70) uniformly. For this, in the present invention, when an adhesive has too high a viscosity to be applied uniformly by spin-coating or screen-printing, a pressurizing means shown in FIG. 3 is employed. The apparatus of FIG. 3 may be utilized by applying an adhesive on the silicon oxide layer disposed and fixed on a lower plate (100), laminating a single crystal plate on the adhesive, covering the single crystal plate with an upper plate (200) equipped with a rod (300) and then applying a pressure to the rod (300) to pressurize a laminate of the silicon oxide layer, the adhesive and the single crystal plate. The terminal portion of the rod (300) is made of an elastic material such as a rubber, and the thickness of the adhesive layer may be adjusted by controlling the pressure applied to the rod (300).

The use of the apparatus of FIG. 3 can provide an adhesive layer having a uniform thickness. Preferably, the thickness of the adhesive layer may range from about 1 to 5 μm (based on dry state).

Subsequently, the heat treatment procedure for curing the adhesive layer (70) to form a bottom electrode may be conducted at a temperature ranging from room temperature to 150° C. for 1 to 24 hours. The lower the curing temperature is or the longer the curing time is, the better the properties of the electrode becomes.

The adhesion of the vibration plate (60) and the single crystal plate (80) may be, alternatively, achieved by forming an electrode layer of a conductive metal such as aluminum, copper and gold on each surface of the vibration plate (60) and the single crystal plate (80), e.g., by a sputtering or electron beam evaporation method; combining the two electrode layers of the vibration plate and the single crystal; and pressurizing the resulting laminate at an elevated temperature, e.g., from 100 to 600° C.

The conductive material of the electrode layer formed on the surface of the vibration plate may be the same as or different from that formed on the single crystal plate. When the two conductive metals to be deposited are the same, diffusion occurs at the interface therebetween. On the other hand, when the two conductive metals to be deposited are different (for instance, aluminum and copper are used), the eutectic phenomena occur. Eutectic phenomena mean that when two or more metals brought into contact with each other, the interfacial region fuses together due to eutectic melting. For example, aluminum has a melting point of 660° C., but an alloy of 80% aluminum and 20% copper which may form at an interface has a lowered melting point of 548.2° C.

In addition, tin(Sn) or its alloy, which has a lower melting point than the metal electrode, may be used as an intermediate layer to fuse the two electrode layers together, which are made of a metal selected from platinum, gold etc. The use of tin make it possible to conduct the pressurizing-heat treating process of the laminate at a lower temperature.

Figure 2D:
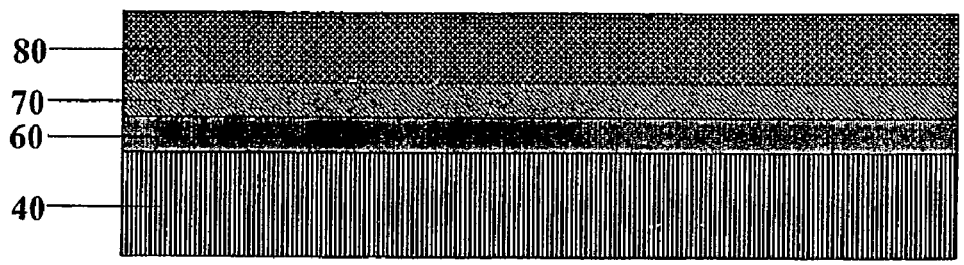

FIG. 2d shows the step of polishing the single crystal plate (80) to form a thin film having about 1 to 100 μm in thick. The polishing step may be conducted before the adhesion step. That is, the single crystal plate (80) may be polished to form a film, and adhered to the vibration plate (60).

The single crystal film structure according to the present invention thus prepared may be employed in the fabrication of various electric or electronic parts or devices including a general type microactuator as shown in FIGS. 2e to 2h.

Figure 2E:
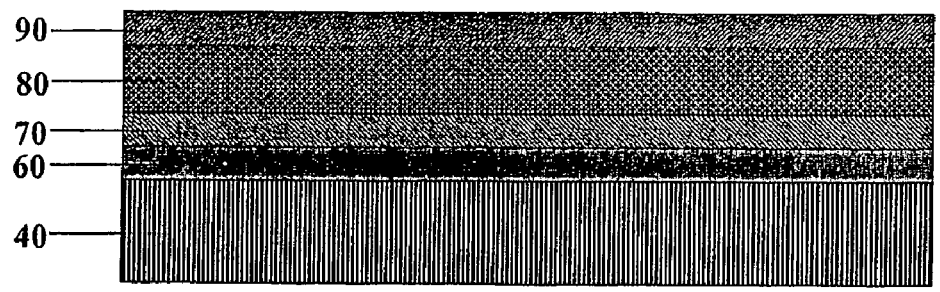

FIG. 2e depicts the step of forming a top electrode (90) on the single crystal film (80) using a sputtering or electronic beam evaporation method. In the prior art method in which a PZT paste is screen-printed and then calcined at 1,000° C. or higher to form a polycrystalline thin film, an expensive metal such as Pt, Au and Ag having a high melting temperature must be used as the top electrode (90). In the present invention, however, an inexpensive material including Al can be used. The thickness of the top electrode may range from about 1 to 5 μm.

Figure 2F:
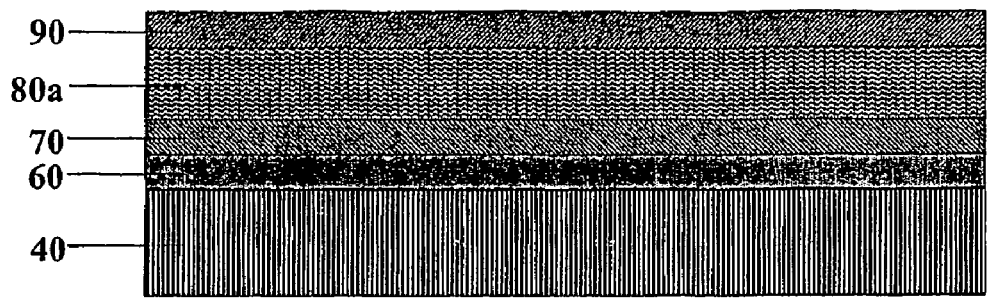

Subsequently, the step of polarizing the single crystal film (80) disposed between the top and bottom electrodes (90 and 70) to obtain a polarized single crystal layer (80a) is shown in FIG. 2f. The polarizing process can be conducted by applying an electric field of 10 to 100 kV/cm to the single crystal film (80) at 100 to 300° C. for 10 to 100 minutes.

Figure 2G:
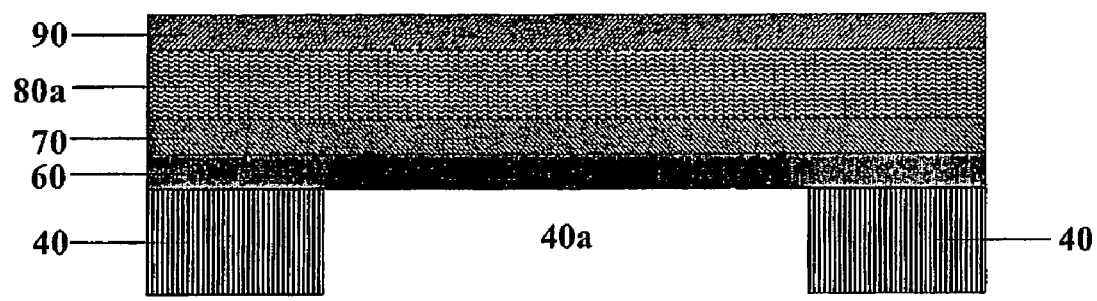
Figure 2H:
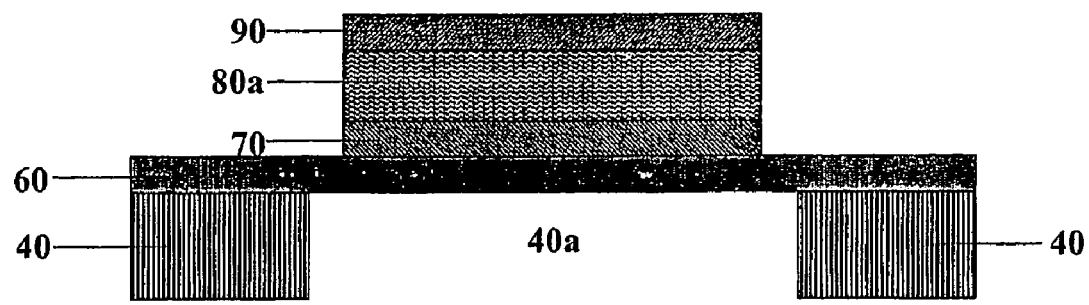

In the next step, the silicon substrate (40) is etched to form a substrate region (40, 40a) as shown in FIG. 2g, and a pattern is formed by properly etching the single crystal film and two electrode layers laminated on the vibration plate as shown in FIG. 2h. The etching process may be conducted in a conventional manner, e.g., using a photoresist or a dry etching or dicing process.

The film structure of ferroelectric single crystal prepared according to the present invention may be used in the fabrication of other electric or electronic parts including a microactuator for an ink jet printer head or a display, an ultrasonic probe, a variable filter, and the like.

Figure 4:
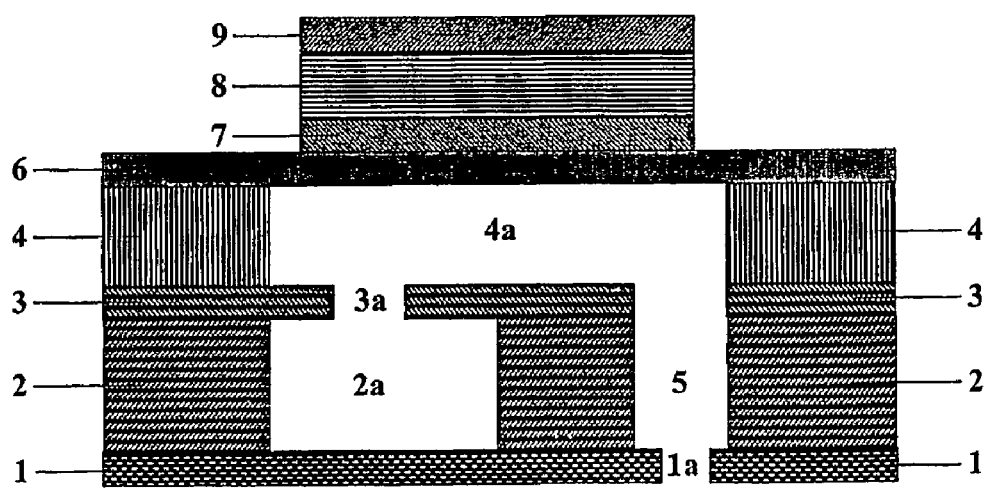
FIG. 4: a cross-sectional view of an example of a piezoelectric type ink-jet printer head fabricated using a microactuator.

FIG. 4 shows a cross-sectional view of a piezoelectric type ink-jet printer head fabricated using a general type microactuator. The piezoelectric type ink jet printer head may be prepared by forming several thin layers (3, 2 and 1) at the substrate region (4, 4a) and etching the layers properly to form a restrictor (3a), a reservoir (2a), a flow path (5) and a nozzle (1a). The printer head can operate by driving the piezoelectric single crystal layer (8) and the vibration plate (6) sequentially disposed on the substrate (4) as a chamber plate, to spout ink via the nozzle (1a). Specifically, when a voltage is applied to the electrodes (7, 9), the piezoelectric single crystal layer (8) undergoes bending deformation and the volume of the chamber (4a) decreases, thus causing the spout of the ink in the chamber (4a) via the flow path (5) and the nozzle (1a). When the electricity is switched off, the piezoelectric single crystal layer (8) recovers to the original size and the volume of the chamber (4a) increases, thus generating a suction force to fill ink into the chamber (4a). That is, the driving force of the microactuator depends on the degree of deformation of the piezoelectric single crystal caused by application of voltage, which in turn depends on the amount of the electric current between the top and the bottom electrodes.

Further, a very thin film structure of ferroelectric single crystal is used in the fabrication of a film bulk acoustic resonator (FBAR) which has been widely used in various communication systems. The piezoelectric film structure prepared by the inventive method has better properties than those of ZnO, AlN or PZT film formed by sputtering according to the prior art method, and thus, can be processed to produce a very thin film having a good dielectric constant.

In addition, the inventive ferroelectric single crystal film structure may be beneficially used in the fabrication of an ultrasonic probe having a wide frequency band of 2 GHz to 7 MHz.

While the invention has been described in connection with the above specific embodiments, it should be recognized that various modifications and changes may be made to the invention by those skilled in the art without departing from the scope of the invention as defined by the appended claims.

What is claimed is:

1. A method for preparing a ferroelectric single crystal film structure comprising the steps of:
    preparing a ferroelectric single crystal plate and a silicon substrate, separately;
    forming a silicon dioxide layer on the silicon substrate;
    applying a heat-curable conductive adhesive layer on the silicon dioxide layer;
    laminating the single crystal plate on the adhesive layer;
    curing the adhesive layer by heat treatment to form a bottom electrode layer;
    polishing the single crystal plate to form a ferroelectric single crystal film;
    forming a top electrode layer on the single crystal film;
    polarizing the single crystal film to obtain a polarized ferroelectric single crystal layer; and
    etching the substrate, the top and bottom electrodes and the polarized single crystal layer in a desired pattern.

2. The method of claim 1, wherein the single crystal plate is polished to a thickness of 1 to 100 μm before and after the adhesion with the substrate.

3. The method of claim 1, wherein the adhesive layer is cured by heat treatment at a temperature ranging from room temperature to 150° C. for 1 to 24 hours.

4. The method of claim 1, wherein the ferroelectric single crystal film structure has a dielectric constant of 1,000 or greater.

5. The method of claim 1, which further comprises forming a conductive metal layer on the surface of the single crystal plate opposite to the adhesive layer by a sputtering or an electronic beam evaporation method.

6. The method of claim 1, wherein the ferroelectric single crystal film structure is a material having the composition of formula (I)

$$x(A)y(B)z(C)-p(P)n(N) \tag{I}$$

wherein,
(A) is $Pb(Mg_{1/3}Nb_{2/3})O_3$ or $Pb(Zn_{1/3}Nb_{2/3})O_3$,
(B) is $PbTiO_3$,
(C) is $LiTaO_3$,
(P) is a metal selected from the group consisting of Pt, Au, Ag, Pd and Rh,
(N) is an oxide of a metal selected from the group consisting of Ni, Co, Fe, Sr, Sc, Ru, Cu and Cd,
x is a number in the range of 0.65 to 0.98,
y is a number in the range of 0.01 to 0.34,
z is a number in the range of 0.01 to 0.1, and
p and n are each independently a number in the range of 0.01 to 5.

* * * * *